(12) United States Patent
Nakamura et al.

(10) Patent No.: US 11,021,118 B2
(45) Date of Patent: Jun. 1, 2021

(54) WIRE HARNESS MANUFACTURING METHOD AND WIRE HARNESS

(71) Applicant: Yazaki Corporation, Tokyo (JP)

(72) Inventors: Masashi Nakamura, Utsunomiya (JP); Masahiro Furukawa, Utsunomiya (JP); Satoshi Enomoto, Utsunomiya (JP); Akiyoshi Kanazawa, Utsunomiya (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 16/294,037

(22) Filed: Mar. 6, 2019

(65) Prior Publication Data

US 2019/0275966 A1 Sep. 12, 2019

(30) Foreign Application Priority Data

Mar. 7, 2018 (JP) .............................. JP2018-041025

(51) Int. Cl.
| | |
|---|---|
| *B60R 16/023* | (2006.01) |
| *H02G 1/00* | (2006.01) |
| *G01R 31/00* | (2006.01) |
| *B60R 16/02* | (2006.01) |
| *G01R 1/06* | (2006.01) |
| *G01R 3/00* | (2006.01) |

(Continued)

(52) U.S. Cl.
CPC ...... *B60R 16/0239* (2013.01); *B60R 16/0207* (2013.01); *G01R 1/06* (2013.01); *G01R 3/00* (2013.01); *G01R 31/006* (2013.01); *H02G 1/00* (2013.01); *H01R 13/62933* (2013.01); *H01R 27/02* (2013.01)

(58) Field of Classification Search
CPC .......... G01R 3/00; G01R 31/006; G01R 1/06; B60R 16/0239; B60R 16/0207; H02G 1/00; H01R 27/02; H01R 13/62933
USPC ........................................................ 361/622
See application file for complete search history.

(56) References Cited

U.S. PATENT DOCUMENTS

| | | | | |
|---|---|---|---|---|
| 5,623,169 A | * | 4/1997 | Sugimoto | ........... B60R 16/0207 307/10.1 |
| 5,675,189 A | * | 10/1997 | Anma | ................. B60R 16/0315 307/9.1 |

(Continued)

FOREIGN PATENT DOCUMENTS

| | | |
|---|---|---|
| EP | 0800254 A2 | 10/1997 |
| EP | 1968246 A1 | 9/2008 |

(Continued)

OTHER PUBLICATIONS

Jul. 29, 2019—(EP) Search Report—App 19159920.8.

*Primary Examiner* — Anatoly Vortman
(74) *Attorney, Agent, or Firm* — Banner & Witcoff, Ltd.

(57) ABSTRACT

A method for manufacturing a wire harness includes: disposing a trunk harness, a branch harness and control boxes on a workbench and attaching the trunk harness and the branch harness to the control boxes; connecting the control boxes to an external device via the branch harness; and switching operation mode of at least one of the control boxes to an information writing mode for inputting information for operating the electric component to be connected to the branch harness into the at least one of the control boxes and then inputting the information from the external device into the at least one of the control boxes via the branch harness.

4 Claims, 5 Drawing Sheets

(51) Int. Cl.
*H01R 13/629* (2006.01)
*H01R 27/02* (2006.01)

(56) References Cited

U.S. PATENT DOCUMENTS

| | | | | |
|---|---|---|---|---|
| 5,808,371 | A * | 9/1998 | Kon'i | B60G 17/0185 |
| | | | | 307/10.1 |
| 5,818,673 | A | 10/1998 | Matsumaru et al. | |
| 6,198,244 | B1 * | 3/2001 | Hayden | B60N 2/0244 |
| | | | | 318/466 |
| 6,791,207 | B2 * | 9/2004 | Yoshida | B60R 16/0315 |
| | | | | 307/10.1 |
| 7,899,954 | B2 | 3/2011 | Kanazawa et al. | |
| 7,999,408 | B2 * | 8/2011 | Fehr | B60R 16/0315 |
| | | | | 307/10.1 |
| 8,304,928 | B2 * | 11/2012 | Nagasawa | B60R 16/0315 |
| | | | | 307/9.1 |
| 10,137,782 | B2 | 11/2018 | Iwasaki et al. | |
| 2008/0218246 | A1 | 9/2008 | Kanazawa et al. | |
| 2016/0059708 | A1 | 3/2016 | Iwasaki et al. | |
| 2016/0059807 | A1 * | 3/2016 | Iwasaki | B60R 16/03 |
| | | | | 307/10.1 |
| 2016/0339853 | A1 * | 11/2016 | Kikuchi | H01B 7/282 |
| 2017/0008466 | A1 * | 1/2017 | Kikuchi | B60R 16/03 |
| 2019/0118739 | A1 | 4/2019 | Takamatsu et al. | |
| 2019/0118742 | A1 | 4/2019 | Takamatsu et al. | |
| 2019/0118743 | A1 | 4/2019 | Takamatsu et al. | |
| 2019/0118744 | A1 | 4/2019 | Takamatsu et al. | |
| 2019/0123472 | A1 | 4/2019 | Takamatsu et al. | |
| 2019/0123480 | A1 | 4/2019 | Takamatsu et al. | |
| 2019/0123920 | A1 | 4/2019 | Takamatsu et al. | |
| 2019/0123937 | A1 | 4/2019 | Takamatsu et al. | |
| 2019/0126860 | A1 | 5/2019 | Takamatsu et al. | |
| 2019/0126862 | A1 | 5/2019 | Sasaki et al. | |
| 2019/0126863 | A1 | 5/2019 | Naganishi et al. | |
| 2019/0126864 | A1 | 5/2019 | Takamatsu et al. | |
| 2019/0126865 | A1 | 5/2019 | Takamatsu et al. | |

FOREIGN PATENT DOCUMENTS

| | | |
|---|---|---|
| JP | 2005-078962 A | 3/2005 |
| JP | 2016-043882 A | 4/2016 |
| JP | 2017-004651 A | 1/2017 |
| JP | 2017-187353 A | 10/2017 |
| WO | 2017/222059 A1 | 12/2017 |

* cited by examiner

WIRE HARNESS MANUFACTURING METHOD AND WIRE HARNESS

CROSS-REFERENCES TO RELATED APPLICATION(S)

This application is based on and claims priority from Japanese Patent Application No. 2018-041025 filed on Mar. 7, 2018, and the entire contents of which are incorporated herein by reference.

BACKGROUND

Field of the Invention

The present invention relates to a wire harness manufacturing method and a wire harness.

Description of Related Art

Circuit bodies (so-called wire harnesses) for connecting power sources and the like to various kinds of electric components and the like mounted on vehicles are known. This type of wire harness is generally configured so as to be able to realize appropriate supply of electric power from an alternator (generator) and a battery serving as main power sources to numerous electric components (for example, an ECU and various kinds of auxiliary machines), to realize appropriate electric power on/off switching, and to realize the transmission of various kinds of communication signals.

More specifically, this kind of wire harness is composed of electric wire bundles each formed of an aggregation of various kinds of electric wires for connecting the power source to electric components; junction boxes for distributing the electric power to a plurality of systems; relay boxes for controlling power on/off for each system; and fuse boxes for protecting the wires and the electric components from, for example, excessive current.

As for details of the above protector, refer to JP 2005-078962 A, JP 2016-043882 A, JP 2017-187353 A, and JP 2017-004651 A.

SUMMARY

In recent years, for example, as the number of electric components to be mounted on vehicles increases and the control of the electric components becomes complicated, the structures of wire harnesses tend to become complicated. As a result, the number of electric wires constituting a wire harness increases, and the wire harness itself increases in size, whereby the weight of the wire harness tends to increase. Furthermore, as the number of differences in vehicle types on which wire harnesses are mounted and the number of the types of optional electric components increase, the number of the types of wire harnesses to be manufactured increases, processes for manufacturing such wire harnesses also become complicated, and the cost and time for manufacturing the wire harnesses also tend to increase.

An object of the present invention is to provide a wire harness manufacturing method and a wire harness wherein the structure of the wire harness is simplified while functions required as a wire harness are maintained.

Embodiments of the present invention provide the following items (1) to (3):

(1) A method for manufacturing a wire harness, the wire harness being mounted on a vehicle body to supply electric power and to transmit a communication signal to an electric component, the wire harness having:

a plurality of control boxes dispersedly arranged on the wire harness and configured to be able to control input and output of at least one of the electric power and the communication signal; a trunk harness connecting one of the plurality of the control boxes to another control box; and a branch harness connecting the control box to the electric component, the manufacturing method comprising:

disposing the trunk harness, the branch harness and the control boxes on a workbench and attaching the trunk harness and the branch harness to the control boxes;

connecting the control boxes to an external device via the branch harness; and switching operation mode of at least one of the control boxes to an information writing mode for inputting information for operating the electric component to be connected to the branch harness into the at least one of the control boxes, and then inputting the information from the external device into the at least one of the control boxes via the branch harness.

(2) The wire harness manufacturing method according to item (1), wherein a conduction inspection for the branch harness is performed in the process for writing the information into the at least one of the control boxes.

(3) The wire harness manufacturing method according to item (1) or item (2), wherein the operation mode of the at least one of the control boxes is switched to the information writing mode by operating the switch provided in the at least one of the control boxes in the process for writing the information into the at least one of the control boxes.

According to first aspect of the invention, relating to the item (1), the framework of the wire harness manufactured by the manufacturing method is composed of the trunk harnesses and the branch harnesses, and the supply of electric power and the transmission of communication signals to the electric components can be controlled by the plurality of control boxes dispersedly arranged on the wire harness. Hence, the structure of the wire harness can be simplified, for example, by concentrating the transmission of the communication signals in a single signal line through multiplex communication between the control boxes and by also concentrating the transmission of the electric power in a single power line in a similar way in comparison with a circuit configuration in which the power source and each electric component are connected one to one in principle as in the conventional wire harness. Furthermore, in the control boxes, junction boxes and the like being used for the conventional wire harnesses can be dispensed with, and the structure of the wire harness can be more simplified by performing processes, such as the distribution of electric power to a plurality of systems, the control of power on/off for each system, and the protection of the electric wires and the electric components from, for example, excessive current.

Furthermore, in the processes for actually manufacturing the wire harness on the workbench (for example, a jig plate), various kinds of information for operating the electric components can be written in the control boxes. Hence, a series of processes can be performed on the workbench, whereby the processes for manufacturing the wire harness can be shortened.

Moreover, in the case that the information for operating the electric component to be connected to the branch harness is written via the branch harness, when the electric component is actually connected to the branch harness at a later process, the electric component can be operated smoothly. In other words, a general-purpose connection port to which the branch harness can be connected may merely be required to be provided in the control box, whereby the connection port exclusive to the electric component is not required to be provided in the control box. That is to say, so-called plug-and-play can be attained.

For example, after the information for operating the electric components that are standardly furnished in a vehicle has been stored standardly in the control boxes, the information for operating, for example, the electric components that are furnished depending on the difference in the type of vehicle and the electric components that are furnished optionally, can be written in the control boxes as necessary through the above-mentioned processes. Accordingly, the specifications of the control boxes can be simplified regardless of, for example, the difference in the type of vehicle on which the wire harness is mounted and the type of optional electric components.

According to second aspect of the invention, relating to the item (2), concurrently with the writing of the information for operating the electric components, the conduction inspections for the branch harnesses can also be performed. Hence, the processes for manufacturing the wire harness can be further shortened.

According to third aspect of the invention, relating to the item (3), the operation mode can be switched to the information writing mode by operating the switch provided in the electric connection box. Hence, since the information is not written unless the switch is operated intentionally, the information can be prevented from being written unintentionally, for example, when the control box mounted on a vehicle is actually operated.

Embodiments of the present invention further provide the following items (4) to (7):

(4) A wire harness routed on a vehicle body to supply electric power and to transmit a communication signal to an electric component, the wire harness comprising:

a plurality of control boxes dispersedly arranged on the wire harness and configured to be able to control input and output of at least one of the electric power and the communication signal; a trunk harness connecting one of the plurality of the control boxes to another control box; and a branch harness connecting the control box to the electric component, at least one of the control boxes being configured to have an information writing mode for inputting information for operating the electric component to be connected to the at least one of the control boxes via the branch harness into the control box from the outside as one of operation modes.

(5) The wire harness according to item (4), wherein the information includes an operation current value for operating the electric component and a maximum current value allowable for the electric component.

(6) The wire harness according to item (4) or item (5), wherein the control box is configured to be able to switch the operation mode of the control box to the information writing mode by operating a switch provided in the control box.

(7) The wire harness according to any one of item (4) to item (6), wherein the control box is configured to be able to input the information via a branch wire connection section for connecting the branch harness.

According to fourth aspect of the invention, relating to the item (4), the framework of the wire harness is composed of the trunk harnesses and the branch harnesses, and the supply of electric power and the transmission of communication signals to the electric components can be controlled by the plurality of control boxes dispersedly arranged on the wire harness. Hence, the structure of the wire harness can be simplified, for example, by concentrating the transmission of the communication signals in a single signal line through multiplex communication between the control boxes and by also concentrating the transmission of the electric power in a single power line in a similar way in comparison with a circuit configuration in which the power source and each electric component are connected one to one in principle as in the conventional wire harness. Furthermore, in the control boxes, junction boxes and the like being used for the conventional wire harnesses can be dispensed with, and the structure of the wire harness can be more simplified by performing processes, such as the distribution of electric power to a plurality of systems, the control of power on/off for each system, and the protection of the electric wires and electric components from, for example, excessive current.

Furthermore, since the operation mode can be switched to the information writing mode in which the information for operating the electric component to be connected to the branch harness is written into the control box, in the case that information for operating a specific electric component is written as necessary, the electric component can be operated smoothly when the electric component is actually connected to the control box. That is to say, so-called plug-and-play can be attained. For example, after the information for operating the electric components that are standardly furnished in a vehicle has been stored standardly in the control boxes, the information for operating, for example, the electric components that are furnished depending on the difference in the type of vehicle and the electric components that are furnished optionally, can be written in the control boxes as necessary. Accordingly, the specifications of the control boxes can be simplified regardless of, for example, the difference in the type of vehicle on which the wire harness is mounted and the type of optional electric components.

According to fifth aspect of the invention, relating to the item (5), the control box is configured so that the operation current value and the maximum current value of the electric component can be set as information for operating the electric component. Hence, various kinds of electric components being different in the operation current value and the maximum current value can be connected to the control box.

According to sixth aspect of the invention, relating to the item (6), the operation mode can be switched to the information writing mode by operating the switch provided in the electric connection box. Hence, since the information is not written unless the switch is operated intentionally, the information can be prevented from being written unintentionally, for example, when the control box mounted on a vehicle is actually operated.

According to seventh aspect of the invention, relating to the item (7), the control box is configured so as to be able to input the above-mentioned information via branch wire connection sections to which the branch harnesses are connected. Hence, a general-purpose connection port to which the branch harness can be connected may merely be required to be provided in the control box, whereby the connection port exclusive to the electric component is not required to be provided in the control box. That is to say, the above-mentioned plug-and-play can be attained more effectively.

The present invention can provide a wire harness manufacturing method and a wire harness wherein the structure of the wire harness is simplified while functions required as a wire harness are maintained.

Several aspects of the invention have been described briefly above. The further details of the invention will be made clearer if the following description is read through with reference to the accompanying drawings.

DETAILED DESCRIPTION

Embodiments

A vehicle wire harness 1 according to an embodiment of the present invention will be described below referring to the drawings.

Figure 1:
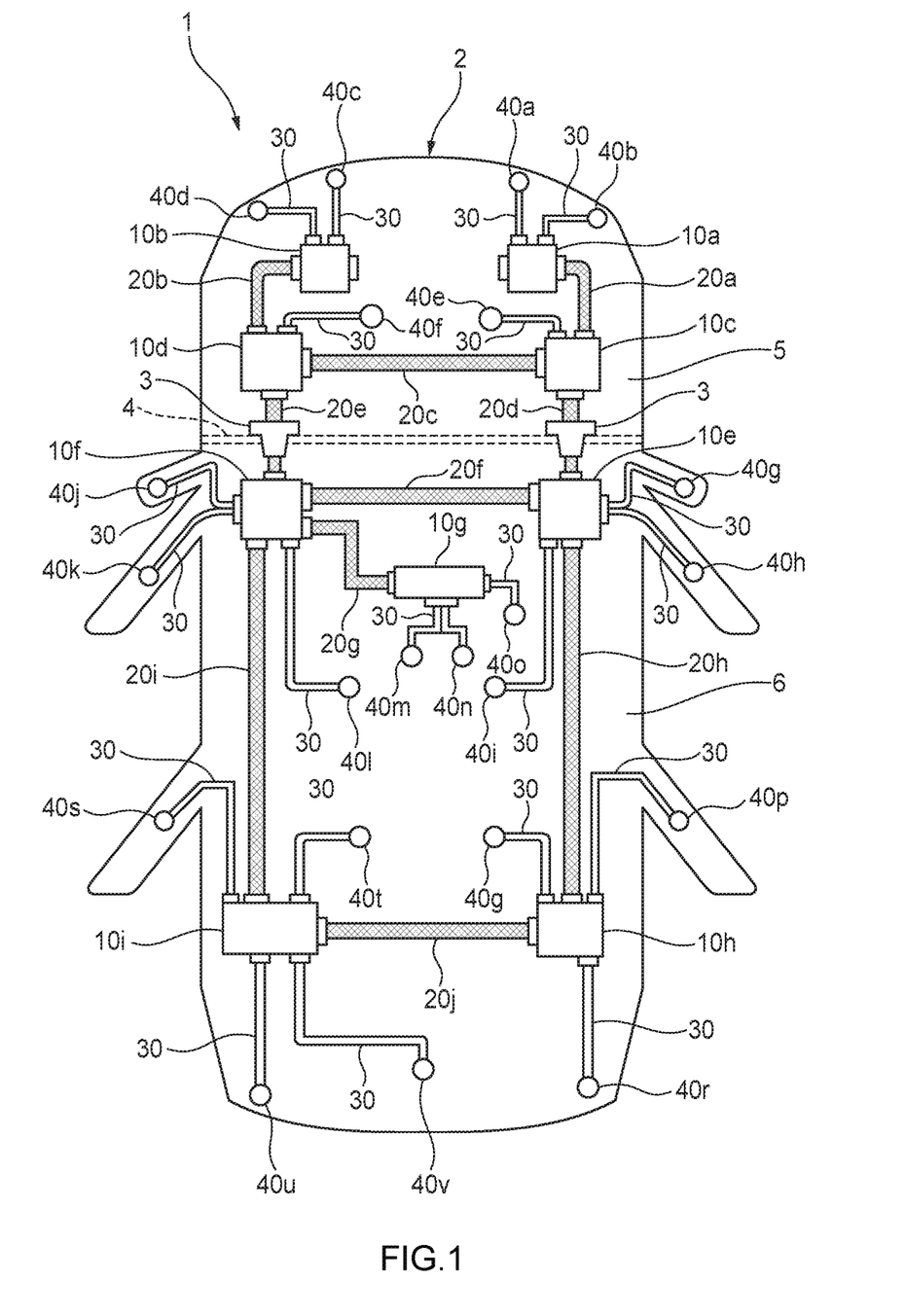
FIG. 1 is a schematic block diagram showing a state in which a wire harness according to an embodiment of the present invention is routed on a vehicle body.

As shown in FIG. 1, the wire harness 1 according to the embodiment of the present invention is typically routed and used on a vehicle body 2 on which various kinds of electric components 40 (40a to 40v) are mounted. The wire harness 1 is equipped with a plurality of electric connection boxes 10 (10a to 10i); trunk harnesses 20 (20a to 20j), each trunk harness being used to electrically connect the electric connection boxes 10 adjacent to each other; and branch harnesses 30, each branch harness being used to electrically connect the electric connection box 10 and the electric component 40 adjacent to each other. The electric connection boxes 10 are dispersedly arranged on the vehicle body 2, configured so as to control electric power and at least the input or output of communication signals, and correspond to "control boxes" in the present invention.

Figure 2:
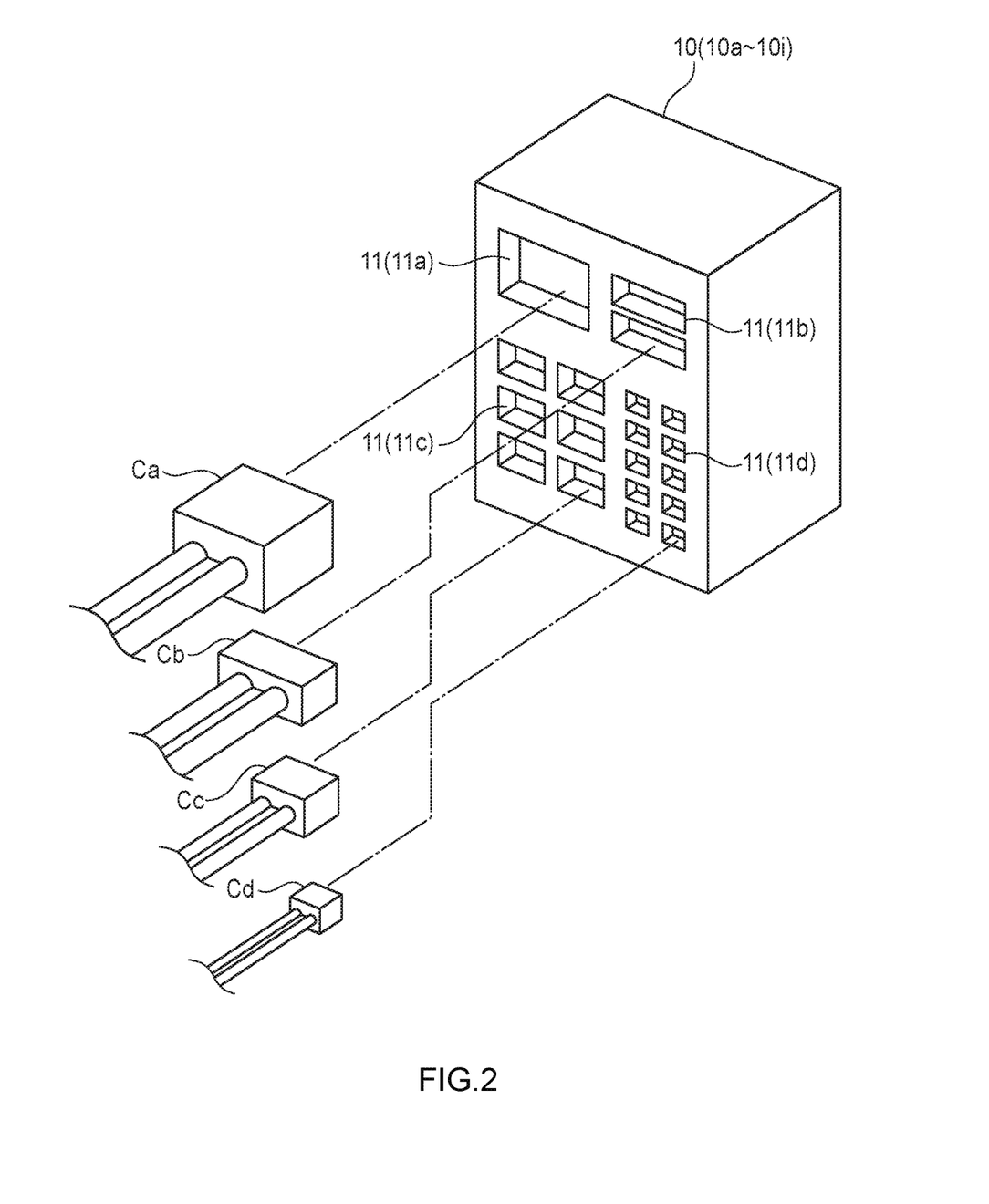
FIG. 2 is a perspective view showing the electric connection box shown in FIG. 1.

Each of the electric connection boxes 10 has a plurality of connector accommodation holes 11 (see FIG. 2). To the plurality of connector accommodation holes 11 of each electric connection box 10, a connector connected to one end section of at least one trunk harness 20 and a connector connected to one end section of at least one branch harness 30 are connected. Hence, each electric connection box 10 is connected to at least one other electric connection box 10 and to at least one electric component 40. The plurality of connector accommodation holes 11 will be described later.

Each electric connection box 10 incorporates a microcomputer (not shown). Each electric connection box 10 refers to the ID information of the other electric connection boxes 10 and the electric components 40 connected thereto via the trunk harnesses 20 and the branch harnesses 30 using this microcomputer, thereby being able to identify the other electric connection boxes 10 and the electric components 40 connected thereto.

Each electric connection box 10 is equipped with a switch (not shown) for switching between an ordinary operation mode that has been designed for the operation at the time when the electric connection box 10 is actually mounted on a vehicle and an information writing mode for inputting information for operating various kinds of electric components (one or more of 40a to 40v) to be connected to the branch harnesses 30 to the electric connection box 10 as necessary. Each electric connection box 10 is configured so as to be able to switch between the ordinary operation mode and the information writing mode by the operation of this switch.

In the ordinary operation mode, each electric connection box 10, on the basis of sensor signals, operation signals, etc. transmitted from the other electric connection boxes 10 and the electric components 40 connected thereto via the trunk harnesses 20 and the branch harnesses 30, can control the electric components 40 connected thereto using the microcomputer and the like. Furthermore, in the case that each electric connection box 10 is connected to two or more other electric connection boxes 10 via two or more trunk harnesses 20, the electric connection box 10 is configured so as to be able to relay the transmission of the sensor signals, the operation signals, etc. between the two or more other electric connection boxes 10 and to relay the transmission of electric power.

In the information writing mode, each electric connection box 10 can write the information for operating the electric components 40 connected thereto via the branch harnesses 30 from the outside as necessary. More specifically, for example, the information for operating the electric components 40 that are standardly furnished in the vehicle body 2 is standardly held beforehand inside the electric connection box 10, and the information for operating the electric components 40 that are furnished depending on the difference in the type of vehicle and the electric components 40 that are furnished optionally can be written into the electric connection box 10 using the information writing mode each time as necessary. Since the electric connection box 10 is equipped with the information writing mode as described above, the specifications of the electric connection box 10 can be simplified.

The information for operating each electric component 40 specifically includes the ID information of the electric component 40; the ordinary operation current value for operating the electric component 40; the maximum current value (so-called cut-off current) allowable for the electric component 40; the power source mode of the electric component 40 (whether the power ON timing is at all times regardless of the position of the IG (ignition) switch or when the position of the IG switch is ON or ACC (accessory) or only when the position of the IG switch is ON; the type of the electric component 40; the mounting place of the electric component 40; etc.

Each trunk harness 20 is equipped with one power line for transmitting electric power; one communication line for transmitting sensor signals, operation signals, etc. by multiplex communication; and a pair of connectors connected to both the ends of one set of the power line and the communication line. In this example, the trunk harness 20 is not provided with a grounding wire for grounding.

The pair of connectors positioned at both the ends of the trunk harness 20 is respectively inserted into and connected to the connector accommodation holes 11 of the electric connection boxes 10 adjacent to each other, whereby the electric connection boxes 10 adjacent to each other are electrically connected by the trunk harness 20, and electric power transmission and multiplex communication are made possible between the electric connection boxes 10 adjacent to each other.

Each branch harness 30 is equipped with one power line for transmitting electric power; one communication line for transmitting sensor signals, operation signals, etc. by multiplex communication; one grounding wire for grounding; and a pair of connectors connected to both the ends of one set of the power line, the communication line and the grounding wire.

The connector positioned at one end of each branch harness 30 is inserted into and connected to an connector accommodation hole 11 of the electric connection box 10, and the connector positioned at the other end of the branch harness 30 is inserted into and connected to the connector accommodation hole (not shown) of an electric component 40, whereby the electric connection box 10 is electrically connected to the electric component 40 by the branch harness 30, and electric power transmission and multiplex communication are made possible between the electric connection box 10 and the electric component 40.

In the example shown in FIG. 1, each electric connection box 10 is disposed at a position relatively close to the position of the electric component 40 mounted on the vehicle body 2 and connected to the electric connection box. Hence, the length of the branch harness 30 connected to each electric connection box 10 is relatively short. On the other hand, of the electric connection boxes 10 adjacent to each other, some have large distances therebetween. Hence, of the plurality of trunk harnesses 20, some having relatively long lengths are included.

More specifically, in the example shown in FIG. 1, an electric connection box 10a is connected to a direction indicator lamp 40a on the right front side of the vehicle body and to a right headlight 40b. An electric connection box 10b is connected to a left headlight 40c and a direction indicator lamp 40d on the left front side of the vehicle body. An electric connection box 10c is connected to a brake control module 40e. An electric connection box 10d is connected to a fuel injection control module 40f. An electric connection box 10e is connected to a right electric door mirror 40g, an electric component 40h for the right front door, and an electric component 40i around the right front electric seat. An electric connection box 10f is connected to a left electric door mirror 40j, an electric component 40k for the left front door, and an electric component 40l around the left front electric seat. An electric connection box 10g is connected to an electric component 40m around the air conditioner, an electric component 40n around the head-up display, and an electric component 40o around the steering wheel. An electric connection box 10h is connected to an electric component 40p for the right rear door, an electric component 40q around the right rear electric seat and a direction indicator lamp 40r on the right rear side of the vehicle body. An electric connection box 10i is connected to an electric component 40s for the left rear door, an electric component 40t around the left rear electric seat, a direction indicator lamp 40u on the left rear side of the vehicle body and a high mount stop lamp 40v.

The electric connection boxes 10a and 10c are connected by a trunk harness 20a. The electric connection boxes 10b and 10d are connected by a trunk harness 20b. The electric connection boxes 10c and 10d are connected by a trunk harness 20c. The electric connection boxes 10c and 10e are connected by a trunk harness 20d. The electric connection boxes 10d and 10f are connected by a trunk harness 20e. The electric connection boxes 10e and 10f are connected by a trunk harness 20f. The electric connection boxes 10f and 10g are connected by a trunk harness 20g. The electric connection boxes 10e and 10h are connected by a trunk harness 20h. The electric connection boxes 10f and 10i are connected by a trunk harness 20i. The electric connection boxes 10h and 10i are connected by a trunk harness 20j.

In particular, trunk harnesses 20d and 20e are respectively inserted into through holes provided in the dash panel 4 of the vehicle body 2. More specifically, grommets 3 (exterior members) into which the trunk harnesses 20d and 20e are respectively inserted are respectively fixed to the through holes, whereby the engine room 5 and the vehicle compartment 6 are liquid-tightly partitioned with the dash panel 4 provided therebetween.

In the example shown in FIG. 1, at least part of each of the plurality of electric components 40 (40a to 40v) mounted on the vehicle body 2 is connected to the grounding point (not shown) of the vehicle body 2 corresponding thereto. For example, in the case that an electric component 40 has a housing made of metal, the electric component 40 can be grounded by electrically connecting (by screwing or the like) the housing and the vehicle body 2 (including a reinforcement and the like). Hence, the branch harness 30 may merely be composed of a power line and a communication line. However, in the case that it is difficult to provide a grounding point near the electric connection box 10 that is connected to the electric component 40, it may be possible that the electric component 40 and the electric connection box 10 are connected using a branch harness 30 equipped with the power line, the communication line and the grounding wire and that the electric connection box 10 is grounded at the electric component 40. In that case, the electric connection box 10 can be grounded via the electric component 40 and the branch harness 30.

Of the plurality of electric components 40, an electric component 40 around which it is difficult to provide a grounding point or an electric component 40 which is covered with a housing made of resin and is difficult to be grounded to the vehicle body 2, it is possible that the electric connection box 10 connected to the electric component 40 via a branch harness 30 is grounded to the vehicle body 2 and that the electric component 40 is grounded via the branch harness 30 and the electric connection box 10.

As a result, since the trunk harness 20 for mutually connecting the electric connection boxes 10 is not required to be provided with a grounding wire in order to ground the plurality of electric connection boxes 10, no grounding wire is provided in the trunk harnesses 20. As described above, of the plurality of trunk harnesses 20, some having relatively long lengths are included. Hence, in comparison with the mode in which the grounding wire is provided for all the plurality of trunk harnesses 20 for mutually connecting the electric connection boxes 10, the total length of the grounding wires in the entire wire harness 1 can be shortened significantly and the wire harness 1 can be made light in weight and compact. Furthermore, since the total length of the grounding wires is shortened significantly, the degree to which noise is applied to the wire harness 1 due to the grounding wires functioning as antennas can also be reduced significantly.

In the example shown in FIG. 1, a plurality of loop circuits is configured by mutually connecting the plurality of electric connection boxes 10 using the plurality of trunk harnesses 20. More specifically, two loop circuits are configured: one loop circuit in which the electric connection box 10c, the trunk harness 20c, the electric connection box 10d, the trunk harness 20e, the electric connection box 10f, the trunk harness 20f, the electric connection box 10e, the trunk harness 20d and the electric connection box 10c are connected sequentially, and the other loop circuit in which the electric connection box 10e, the trunk harness 20f, the electric connection box 10f, the trunk harness 20i, the electric connection box 10i, the trunk harness 20j, the electric connection box 10h, the trunk harness 20h and the electric connection box 10e are connected sequentially.

Hence, even if an abnormality such as disconnection occurs in part of a trunk harness 20, a detour route is easily secured. Hence, the wire harness 1 can drastically enhance the redundancy of a system in which the wire harness 1 is used.

The plurality of connector accommodation holes 11 provided in the electric connection box 10 will be described below referring to FIG. 2. As shown in FIG. 2, the electric connection box 10 is provided with the plurality of connector accommodation holes 11 having plural kinds of sizes. The plural kinds of sizes include a size corresponding to the size of a single connector accommodation hole 11 (corresponding to the size of a connector accommodation holes 11a), and also include sizes corresponding to the sizes of a plurality of connector accommodation holes 11 (corresponding to the sizes of connector accommodation holes 11b to 11d).

In the example shown in FIG. 2, a plurality of accommodation holes 11 having four kinds of sizes is formed; more specifically, one connector accommodation holes 11a, two connector accommodation holes 11b, six connector accommodation holes 11c, and ten connector accommodation holes 11d are formed in decreasing order of size. The connectors Ca to Cd of sub-harnesses having the sizes corresponding to the sizes of the connector accommodation holes 11a to 11d are connected to the connector accommodation holes 11a to 11d, respectively. More specifically, the connectors Ca to Cd are connectors connected to the end sections of the trunk harnesses 20 or connectors connected to the end sections of the branch harnesses 30.

In the example shown in FIG. 2, as the magnitude of the current flowing in the sub-harness is larger, the connector (Ca to Cd) having a larger size is connected to the sub-harness. Hence, the size of a connector accommodation hole 11 corresponds to the magnitude of the current flowing in the sub-harness connected to the connector accommodation hole 11 (more specifically, the magnitude of the current flowing in the power line of the trunk harness 20 and the magnitude of the current flowing in the power line of the branch harness 30. As a result, in comparison with a mode in which the sizes of the plurality of sub-harnesses and the sizes of the plurality of accommodation holes 11 are unified into the largest size, the electric connection box 10 is not required to have excessive specifications, whereby the electric connection box 10 can be made compact significantly.

Furthermore, as described above, each electric connection box 10 refers to the ID information of the connection destination of the sub-harness connected thereto using the incorporated microcomputer, thereby being capable of identifying the connection destination. In other words, the electric connection box 10 has connection interchangeability. Hence, in the case that the connectors of a plurality of sub-harnesses having the same size are connected to the corresponding plurality of accommodation holes 11 having the same size, the electric connection box 10 can recognize the connection destinations of the respective connectors and can form a desired circuit regardless of to which of the plurality of connector accommodation holes 11 the respective connectors are connected. As a result, in comparison with a mode in which the connector accommodation holes 11 to which the respective connectors should be connected have been designated respectively, the burden of the worker at the time when the connectors of the sub-harnesses are connected to the connector accommodation holes 11 can be reduced significantly.

Next, an example of a method for manufacturing the above-mentioned wire harness 1 will be described referring to FIGS. 3 to 5.

Figure 3:
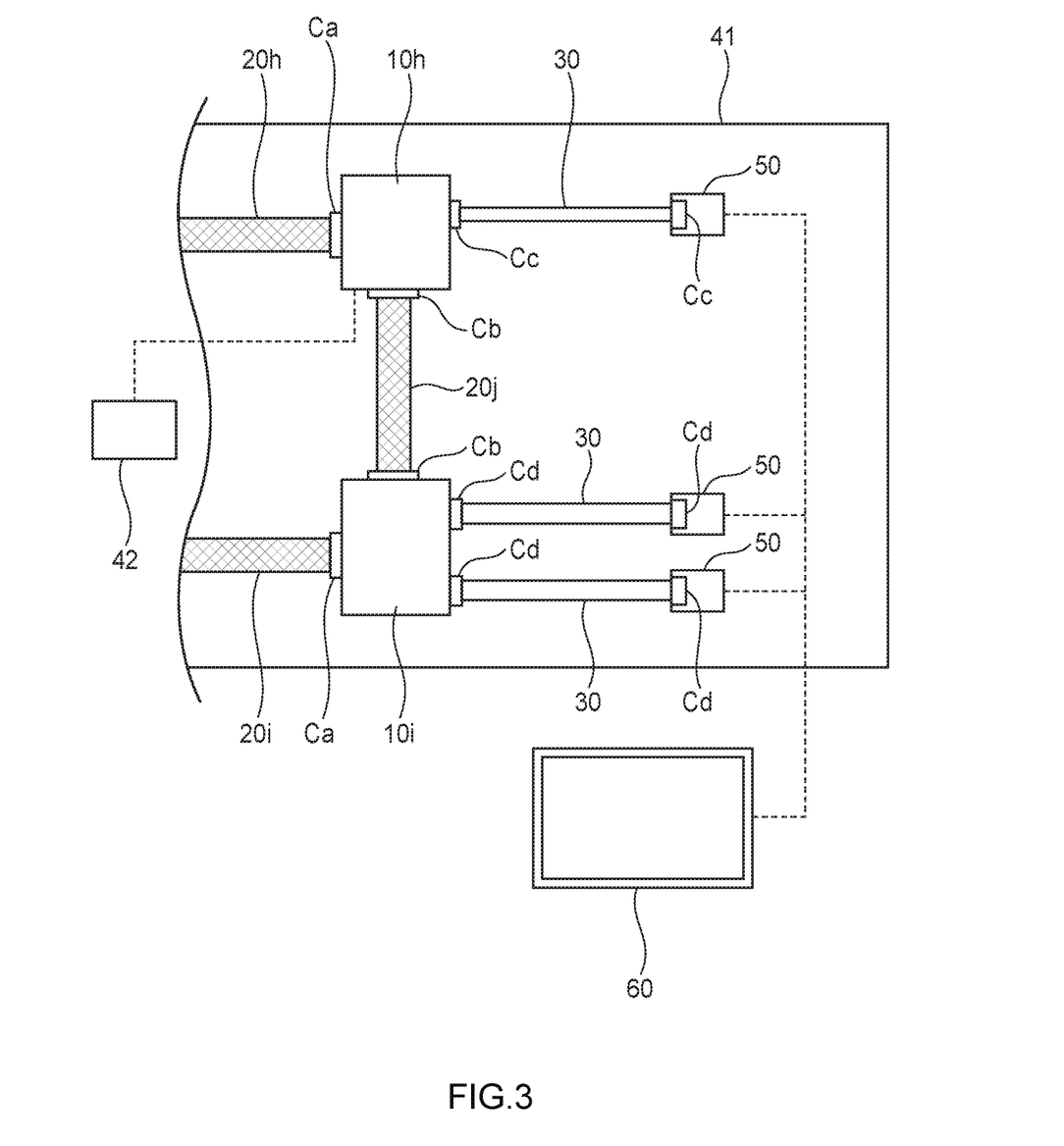
FIG. 3 is a schematic block diagram showing a state in which the electric connection boxes and an external device are connected via branch harnesses and checker fixtures while the wire harness shown in FIG. 1 is placed on a workbench.

First, as shown in FIG. 3, the electric connection boxes 10, the trunk harnesses 20 and the branch harnesses 30 are disposed and fixed onto a workbench 41 (a jig plate or the like) so as to correspond to the shape of the routing paths to the vehicle body 2. Furthermore, the electric connection box 10 and the trunk harness 20 corresponding to each other are connected, and the electric connection box 10 and the branch harness 30 corresponding to each other are connected. The connection between the electric connection box 10 and the trunk harness 20 is attained by accommodating the connector connected to one end section of the branch harness 30 into any one of the connector accommodation holes 11 of the electric connection box 10. The connection between the electric connection box 10 and the branch harness 30 is attained by accommodating the connector connected to one end section of the branch harness 30 into any one of the connector accommodation holes 11 of the electric connection box 10.

In the example shown in FIG. 3, in the electric connection box 10h, the connector Ca connected to one end section of the trunk harness 20h is accommodated in the connector accommodation hole 11a, the connector Cb connected to one end section of the trunk harness 20j is accommodated in the connector accommodation hole 11b, and the connector Cc connected to one end section of the branch harness 30 is accommodated in the connector accommodation hole 11c (also see FIG. 2). In the electric connection box 10i, the connector Ca connected to one end section of the trunk harness 20i is accommodated in the connector accommodation hole 11a, the connector Cb connected to the other end section of the trunk harness 20j is accommodated in the connector accommodation hole 11b, and the connectors Cd connected to one end sections of the two branch harnesses 30 are respectively accommodated in the connector accommodation holes 11d (also see FIG. 2).

Next, the connectors connected to the other end sections of the branch harnesses 30 having been connected to the electric connection boxes 10 are connected to the corresponding checker fixtures 50 fixed and disposed on a workbench 41. Each checker fixture 50 is electrically connected to an external device 60 having both a conduction inspection function and an information writing function.

Figure 4:
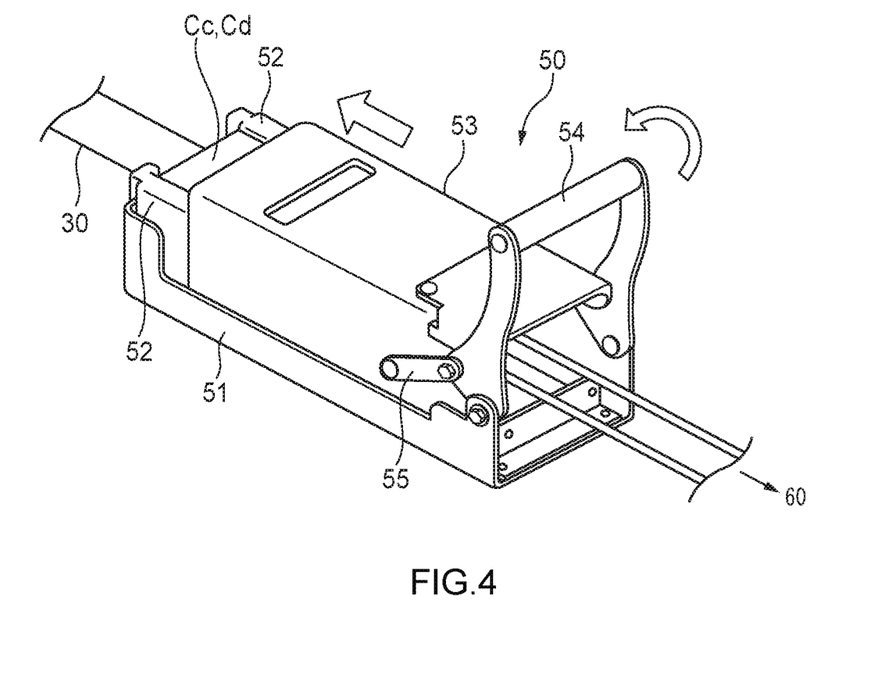
FIG. 4 is a perspective view showing the checker fixture shown in FIG. 3.
Figure 5:
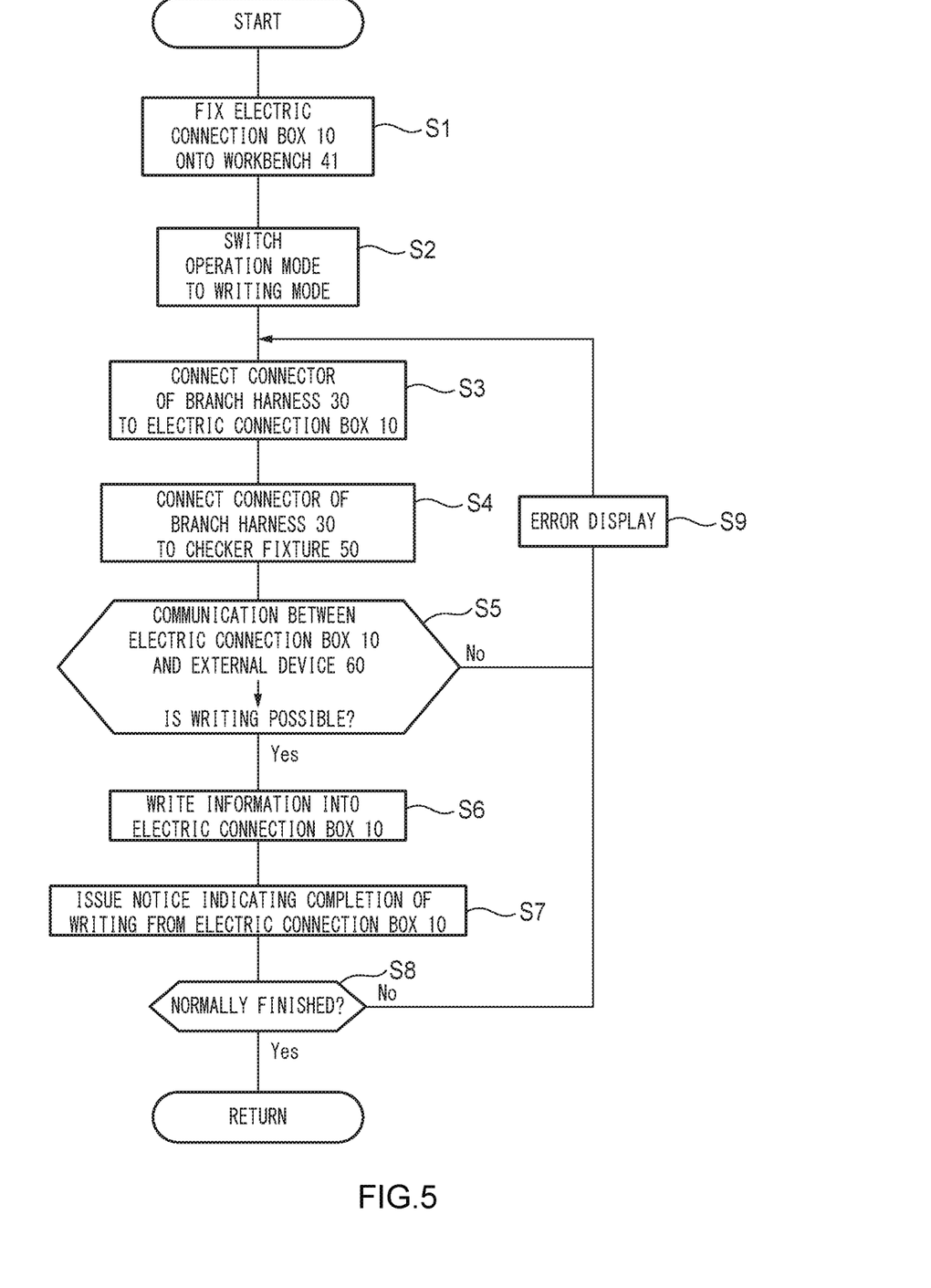
FIG. 5 is a flow chart showing the flow of the process to be performed when information for operating an electric component is written into the electric connection box from the external device via the branch harness.

As shown in FIG. 4, the checker fixture 50 has a substrate 51 made of metal, formed of a pair of side plates and a bottom plate, and extending in the front-rear direction. The substrate 51 is placed and fixed onto the workbench 41. At the front end section of the substrate 51, a pair of holding members 52 made of resin and used to hold the connector connected to the other end section of the branch harness 30 is disposed and fixed so as to be opposed to each other in the left-right direction. The connector connected to the other end section of the branch harness 30 is disposed and fixed onto the substrate 51 between the pair of the holding members 52.

On the substrate 51, a cover 53 made of metal, formed of a pair of side plates and a top plate, and extending in the front-rear direction is mounted on the substrate 51 so as to be relatively movable in the front-rear direction with respect to the substrate. A connector (not shown) made of resin is integrally provided on the inner side face of the cover 53. The external device 60 is electrically connected to the connector.

The cover 53 is connected to the substrate 51 via a lever 54 and links 55. As a result, the position of the cover 53 with respect to the substrate 51 in the front-rear direction can be adjusted by rotating the lever 54 in the front-rear direction.

In the state in which the lever 54 is located at the position shown in FIG. 4, the connector (the connector Cc or Cd in FIG. 3) connected to the other end section of the branch harness 30 is disposed and fixed onto the substrate 51 provided between the pair of holding members 52. The connector connected to the other end section of the branch harness 30 is fitted into the connector inside the cover 53 by rotating the lever 54 forward so as to move the cover 53 (consequently, the connector inside the cover 53) forward (see the arrows in FIG. 4). As a result, the branch harness 30 (consequently, the electric connection box 10) and the external device 60 are electrically connected.

As a result, it is possible to obtain the state in which, on the workbench 41 and to the respective electric connection boxes 10, the trunk harnesses 20 and the branch harnesses 30 corresponding to the respective electric connection boxes 10 are connected, and the other end sections of the respective branch harnesses 30 are electrically connected to the external device 60 via the checker fixtures 50.

(In the Case that the Writing of Information into an Electric Connection Box is not Performed)

In the case that the task for writing information for operating an electric component 40 into an electric connection box 10 is not performed, in this state, a power source 42 is connected to any one of the electric connection boxes 10 (the electric connection box 10h in the example shown in FIG. 3), and conduction inspections are performed, for example, for the respective branch harnesses 30 using the external device 60. The wire harness 1 is completed by confirming that all the results of the conduction inspections are acceptable.

(In the Case that the Writing of Information into an Electric Connection Box is Performed)

On the other hand, information for operating an electric component 40 can be written into an electric connection box 10 as necessary using the above-mentioned information writing mode of the electric connection box 10. Of the tasks in this case, only the task particularly relating to the writing of information will be described below referring to FIG. 5.

First, an electric connection box 10 is fixed onto the workbench 41 (at S1), and the operation mode of the electric connection box 10 is switched from the ordinary operation mode to the information writing mode by the switch operation of the electric connection box 10 (at S2). Next, the connector connected to one end section of a branch harness 30 is connected to the electric connection box 10 (at S3), and the connector connected to the other end section of the branch harness 30 is connected to the checker fixture 50 (at S4). Hence, the electric connection box 10 and the external device 60 are connected via the branch harness 30. Furthermore, the power source 42 is connected to the electric connection box 10.

Next, communication is mutually performed between the electric connection box 10 and the external device 60, and a judgment is made as to whether information writing is possible. More specifically, for example, a question about the electric component 40 to be connected is asked from the electric connection box 10 to the external device 60, and the answer to the question is given from the external device 60 to the electric connection box 10. In response to this, in the case that an answer stating that information writing from the electric connection box 10 to the external device 60 is possible is given, it is judged that information writing is possible (YES at S5). On the other hand, in the case that it is not judged that information writing is possible (NO at S5), error display is shown on the external device 60 (at S9).

In the case that it is judged that information writing is possible (YES at S5), information for operating the electric component 40 is written from the external device 60 into the electric connection box 10 (at S6). After information writing is completed, a notice indicating the completion of the writing is issued from the electric connection box 10 to the external device 60 (at S7). After that, it is judged whether the information writing is normally finished (at S8). In the case that it is judged that information writing is normally finished (YES at S8), a series of processes is completed. On the other hand, in the case that it is not judged that information writing is not normally finished (NO at S8), error display is shown on the external device 60 (at S9).

As described above, the information for operating the electric component 40 can be written into the electric connection box 10 using the information writing mode of the electric connection box 10.

In this case, during the above-mentioned series of writing processes, communication is performed between the electric connection box 10 and the external device 60 via the branch harness 30. The fact that this communication is performed also means that the branch harness 30 is conductive normally as a matter of course. Hence, the above-mentioned information writing and conduction inspections are performed simultaneously and concurrently. Hence, the working processes for manufacturing the wire harness 1 can be shortened.

As described above, with the wire harness 1 and the method for manufacturing the wire harness 1 according to the embodiments of the present invention, the framework of the wire harness 1 manufactured by the manufacturing method is composed of the trunk harnesses 20 and the branch harnesses 30, and the supply of electric power and the transmission of communication signals to the electric components 40 can be controlled by the plurality of electric connection boxes 10 dispersedly arranged on the wire harness 1. Hence, the structure of the wire harness 1 can be simplified, for example, by concentrating the transmission of the communication signals in a single signal line through multiplex communication between the electric connection boxes 10 and by also concentrating the transmission of the electric power in a single power line in a similar way in comparison with a circuit configuration in which the power source and each electric component 40 are connected one to one in principle as in the conventional wire harness. Furthermore, in the electric connection boxes 10, junction boxes and the like being used for the conventional wire harnesses can be dispensed with, and the structure of the wire harness 1 can be more simplified by performing processes, such as the distribution of electric power to a plurality of systems, the control of power on/off for each system, and the protection of the electric wires and the electric components 40 from, for example, excessive current.

Furthermore, in the manufacturing process for attaching the trunk harnesses 20 and the branch harnesses 30 to the electric connection boxes 10 on the workbench 41 (for example, a jig plate), information for operating the electric components 40 is written into the electric connection boxes 10. Hence, a series of processes can be performed on the workbench 41, whereby the working processes can be shortened.

Moreover, in the case that the information for operating the electric component 40 to be connected to the branch harness 30 is written via the branch harness 30, when the electric component 40 is actually connected to the branch harness 30 at a later process, the electric component 40 can be operated smoothly. In other words, a general-purpose connection port (the connector accommodation hole 11) to which the branch harness 30 can be connected may merely be required to be provided in the control box 10, whereby a connection port exclusive to the electric component 40 is not required to be provided in the control box 10. That is to say, so-called plug-and-play can be attained.

Hence, for example, after the information for operating the electric components 40 that are standardly furnished in a vehicle has been stored standardly in the control boxes 10, the information for operating, for example, the electric components 40 that are furnished depending on the difference in the type of vehicle and the electric components that are furnished optionally, can be written in the control boxes 10 as necessary through the above-mentioned processes. Accordingly, the specifications of the control boxes 10 can be simplified regardless of, for example, the difference in the type of vehicle on which the wire harness 1 is mounted and the type of optional electric components.

Furthermore, concurrently with the writing of the information for operating the electric components 40, the conduction inspections for the branch harnesses 30 are also performed. Hence, the working processes for manufacturing the wire harness 1 can be further shortened.

Moreover, the ordinary operation mode is switched to the information writing mode by operating the switch provided in the electric connection box 10. Hence, information is suppressed from being written erroneously in the electric connection box 10 that is operating in the ordinary operation mode.

Other Embodiments

In addition, the invention is not limited to the aforementioned embodiments, but various modifications can be used within the scope of the invention. For example, the invention is not limited to the aforementioned embodiments, but changes, improvements, etc. can be made on the invention suitably. In addition, materials, shapes, dimensions, numbers, arrangement places, etc. of respective constituent elements in the aforementioned embodiments are not limited. Any materials, any shapes, any dimensions, any numbers, any arrangement places, etc. may be used as long as the invention can be attained.

For example, in the above-mentioned embodiments, the electric connection box 10 is taken as an example of the "control box" according to the present invention. More specifically, the electric connection box 10 is configured so as to be able to perform processes, such as the distribution of electric power to a plurality of systems, the control of power on/off for each system, and the protection of the electric wires and the electric components from, for example, excessive current. However, the "control box" according to the present invention is not limited to the electric connection box 10, but may be equipped with only one of the above-mentioned various kinds of functions or may be equipped with a plurality of functions selected from among the above-mentioned various kinds of functions. Furthermore, an electric load (for example, an ECU or a connector with a control function) to be connected to a wire harness is taken as another example of the "control box."

Moreover, in the above-mentioned embodiments, the electric connection box 10 is equipped with the switch (not shown) for switching over between the ordinary operation mode and the information writing mode. On the other hand, instead of being provided with this kind of switch, the electric connection box 10 may be configured so that the switching from the ordinary operation mode to the information writing mode is performed automatically by connecting the power source 42 (see FIG. 3) to a specific connector accommodation hole of the electric connection box 10. In this case, the switching from the information writing mode to the ordinary operation mode is performed automatically by disconnecting the power source 42 from the electric connection box 10.

The characteristics of the method for manufacturing the wire harness 1 and the characteristics of the wire harness 1 according to the embodiments of the above-mentioned present invention will herein be briefly summarized and listed in the following items (1) to (7).

(1) A method for manufacturing a wire harness (1), the wire harness (1) being mounted on a vehicle body (2) to supply electric power and to transmit a communication signal to an electric component (40), the wire harness (1) having:

a plurality of control boxes (10) dispersedly arranged on the wire harness (1) and configured to be able to control input and output of at least one of the electric power and the communication signal; a trunk harness (20) connecting one of the plurality of the control boxes (10) to another control box; and a branch harness (30) connecting the control box to the electric component (40), the manufacturing method comprising:

disposing the trunk harness (20), the branch harness (30) and the control boxes (10) on a workbench (41) and attaching the trunk harness (20) and the branch harness (30) to the control boxes (10);

connecting the control boxes (10) to an external device (60) via the branch harness (30); and switching operation mode of at least one of the control boxes (10) to an information writing mode for inputting information for operating the electric component (40) to be connected to the branch harness (30) into the at least one of the control boxes (10), and then inputting the information from the external device (60) into the at least one of the control boxes (10) via the branch harness (30).

(2) The wire harness (1) manufacturing method according to item (1), wherein a conduction inspection for the branch harness (30) is performed in the process for writing the information into the at least one of the control boxes (10).

(3) The wire harness (1) manufacturing method according to item (1) or item (2), wherein the operation mode of the at least one of the control boxes (10) is switched to the information writing mode by operating the switch provided in the at least one of the control boxes (10) in the process for writing the information into the at least one of the control boxes (10).

(4) A wire harness (1) routed on a vehicle body (2) to supply electric power and to transmit a communication signal to an electric component (40), the wire harness (1) comprising:

a plurality of control boxes (10) dispersedly arranged on the wire harness (1) and configured to be able to control input and output of at least one of the electric power and the communication signal; a trunk harness (20) connecting one of the plurality of the control boxes (10) to another control box; and a branch harness (30) connecting the control box to the electric component (40), at least one of the control boxes (10) being configured to have an information writing mode for inputting information for operating the electric component (40) to be connected to the at least one of the control boxes (10) via the branch harness (30) into the control box from the outside as one of operation modes.

(5) The wire harness (1) according to item (4), wherein the information includes an operation current value for operating the electric component (40) and a maximum current value allowable for the electric component (40).

(6) The wire harness (1) according to item (4) or item (5), wherein the control box is configured to be able to switch the operation mode of the control box to the information writing mode by operating a switch provided in the control box.

(7) The wire harness (1) according to any one of item (4) to item (6), wherein the control box is configured to be able to input the information via a branch wire connection section (11c, 11d) for connecting the branch harness (30).

REFERENCE SIGNS LIST 1 wire harness
2 vehicle body
10 electric connection box (control box)
11c connector accommodation hole (branch wire connection section)
11d connector accommodation hole (branch wire connection section)
20 trunk harness
30 branch harness
40 electric component
41 workbench
60 external device

The invention claimed is:

1. A wire harness routed on a vehicle body to supply electric power and to transmit a communication signal to an electric component, the wire harness comprising:

a plurality of control boxes dispersedly arranged on the wire harness and configured to control input and output of at least one of the electric power and the communication signal;

a trunk harness connecting one of the plurality of the control boxes to another one of the plurality of control boxes; and a branch harness connecting the control box to the electric component, at least one of the control boxes being configured to have, as one of a plurality of operation modes, an information writing mode for inputting external information, from an external device via the branch harness into the control box, for operating the electric component to be connected to the at least one of the control boxes, the trunk harness including a power line for transmitting the electric power, and a communication line for transmitting the communication signal, and not including a ground line, and the branch harness including a power line for transmitting the electric power, a communication line for transmitting the communication signal, and an earth a ground line.

2. The wire harness according to claim 1, wherein the external information includes an operation current value for operating the electric component and a maximum current value allowable for the electric component.

3. The wire harness according to claim 1, wherein the control box is configured to switch the operation mode of the control box to the information writing mode by operating a switch provided in the control box.

4. The wire harness according to claim 1, wherein the control box is configured to input the external information via a branch wire connection section for connecting the branch harness.

* * * * *